United States Patent
Lin

(10) Patent No.: US 10,540,276 B2
(45) Date of Patent: Jan. 21, 2020

(54) METHOD OF PROCESSING DATA BASED ON ERASE OPERATIONS OF LOGICAL PAGES RELATED TO DATA COMPRESSION RATE OF MAPPING TABLE IN DATA STORAGE DEVICE

(71) Applicant: Silicon Motion, Inc., Jhubei (TW)

(72) Inventor: Wen-Sheng Lin, Kaohsiung (TW)

(73) Assignee: Silicon Motion, Inc., Jhubei (TW)

( * ) Notice: Subject to any disclaimer, the term of this patent is extended or adjusted under 35 U.S.C. 154(b) by 1 day.

(21) Appl. No.: 16/039,787

(22) Filed: Jul. 19, 2018

(65) Prior Publication Data
US 2019/0188125 A1    Jun. 20, 2019

(30) Foreign Application Priority Data
Dec. 18, 2017  (TW) ................ 106144391 A

(51) Int. Cl.
*G06F 12/02*  (2006.01)
*G06F 12/1009*  (2016.01)
(Continued)

(52) U.S. Cl.
CPC .......... *G06F 12/0246* (2013.01); *G06F 3/061* (2013.01); *G06F 3/064* (2013.01);
(Continued)

(58) Field of Classification Search
CPC ................ G09G 5/00; G09G 2340/14; G09G 2340/0492; G09G 2340/0464; G09G 2340/0407; G09G 5/14; G06F 17/211; G06F 12/0246; G06F 12/1009; G06F 3/064; G06F 3/0652; G06F 3/061; G06F 13/24; G06F 3/0679; G06F 2212/652; G06F 2212/401; G06F 2212/7201;
(Continued)

(56) References Cited

U.S. PATENT DOCUMENTS

2006/0212674 A1* 9/2006 Chung ................ G06F 12/0246
                                                          711/202
2007/0016721 A1* 1/2007 Gay ..................... G06F 12/0246
                                                          711/103
(Continued)

FOREIGN PATENT DOCUMENTS

| | | |
|---|---|---|
| CN | 106157066 A | 11/2016 |
| TW | 201415468 A | 4/2014 |
| TW | 201606776 A | 2/2016 |

*Primary Examiner* — Hong C Kim
(74) *Attorney, Agent, or Firm* — Wang Law Firm, Inc.

(57) ABSTRACT

A data storage device includes a memory device, an SRAM and a controller. The memory device includes a first buffer configured to store data of a plurality of consecutive logical pages. The SRAM stores a first mapping table. The first mapping table records which logical page the data stored in each physical page of the first buffer directs to. The controller is coupled to the memory device and the SRAM. When the controller performs an erase operation to erase the data stored in the first buffer in response to an erase command, the controller checks whether an interrupt signal or a reset command issued by a host device has been received every time the erase operations of a predetermined number (M) of logical pages have finished. The predetermined number (M) is a positive integer greater than 1.

10 Claims, 4 Drawing Sheets

(51) Int. Cl.
*G11C 16/16* (2006.01)
*G06F 13/24* (2006.01)
*G06F 3/06* (2006.01)
*G11C 11/56* (2006.01)

(52) U.S. Cl.
CPC .......... *G06F 3/0652* (2013.01); *G06F 3/0679* (2013.01); *G06F 12/1009* (2013.01); *G06F 13/24* (2013.01); *G11C 11/5635* (2013.01); *G11C 16/16* (2013.01); *G06F 2212/401* (2013.01); *G06F 2212/652* (2013.01); *G06F 2212/7201* (2013.01); *G06F 2212/7203* (2013.01); *G11C 2211/5641* (2013.01)

(58) Field of Classification Search
CPC ........ G06F 2212/7203; H04N 21/4316; G11C 11/5635; G11C 16/16; G11C 2211/5641

USPC .......... 711/103, 206, 104, 170; 710/68, 260; 707/693, 803; 709/247
See application file for complete search history.

(56) References Cited

U.S. PATENT DOCUMENTS

| | | | | |
|---|---|---|---|---|
| 2012/0144102 | A1* | 6/2012 | Langlois | G06F 12/0246 711/103 |
| 2013/0067146 | A1* | 3/2013 | Zettsu | G06F 12/02 711/103 |
| 2014/0136753 | A1* | 5/2014 | Tomlin | G06F 12/0246 711/103 |
| 2015/0178188 | A1* | 6/2015 | Grin | G06F 12/0246 711/103 |
| 2016/0162201 | A1* | 6/2016 | Adam | G06F 3/0613 711/103 |

* cited by examiner

METHOD OF PROCESSING DATA BASED ON ERASE OPERATIONS OF LOGICAL PAGES RELATED TO DATA COMPRESSION RATE OF MAPPING TABLE IN DATA STORAGE DEVICE

CROSS REFERENCE TO RELATED APPLICATIONS

This Application claims priority of Taiwan Patent Application No. 106144391, filed on Dec. 18, 2017, the entirety of which is incorporated by reference herein.

BACKGROUND OF THE INVENTION

Field of the Invention

The invention relates to a data processing method that is suitable for a flash memory device and capable of preventing content of mapping tables from being unsynchronized.

Description of the Related Art

With the rapid growth of data storage technology in recent years, many data storage devices—such as memory cards manufactured in compliance with the SD/MMC standards, CF standards, MS standards or XD standards, as well as solid state hard drives, Embedded Multi Media Cards (eMMC) and Universal Flash Storage (UFS)—have been used widely for a variety of purposes. Therefore, effective control of access to these data storage devices is an important issue.

In order to improve the access performance of these data storage devices, a novel data processing method, which is capable of preventing content of mapping tables from being unsynchronized and further improving the access performance of the data storage device, is proposed.

BRIEF SUMMARY OF THE INVENTION

A data storage device and methods for processing data stored in a memory device are provided. An exemplary embodiment of a data storage device comprises a memory device, an SRAM and a controller. The memory device comprises a first buffer configured to store data of a plurality of consecutive logical pages. The SRAM is configured to store a first mapping table. The first mapping table records which logical page the data stored in each physical page of the first buffer directs to. The controller is coupled to the memory device and the SRAM. When the controller performs an erase operation to erase the data stored in the first buffer in response to an erase command, the controller checks whether an interrupt signal or a reset command issued by a host device has been received every time the erase operations of a predetermined number (M) of logical pages have finished. The predetermined number (M) is a positive integer greater than 1.

An exemplary embodiment of a method for processing data stored in a memory device, suitable for a data storage device comprising a memory device, a Static Random Access Memory (SRAM) and a controller, the memory device comprising a first buffer configured to store data of a plurality of consecutive logical pages, the SRAM being configured to store a first mapping table, comprises: editing, by the controller, the first mapping table according to a data compression rate (R), wherein the first mapping table records which logical page the data stored in each physical page of the first buffer directs to, and wherein information regarding a portion of the logical pages having data stored in the first buffer is not recorded in the first mapping table; performing, by the controller, an erase operation to erase the data stored in the first buffer in response to an erase command; and when performing the erase operation to erase the data stored in the first buffer in response to the erase command, checking, by the controller, whether an interrupt signal or a reset command issued by a host device has been received every time the erase operations of a predetermined number (M) of logical pages have finished, wherein the predetermined number (M) is a positive integer greater than 1, and wherein the predetermined number is related to the data compression rate (R) of the first mapping table.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims. It should be understood that the following embodiments may be implemented by software, hardware, firmware, or any combination of the above.

Figure 1A:
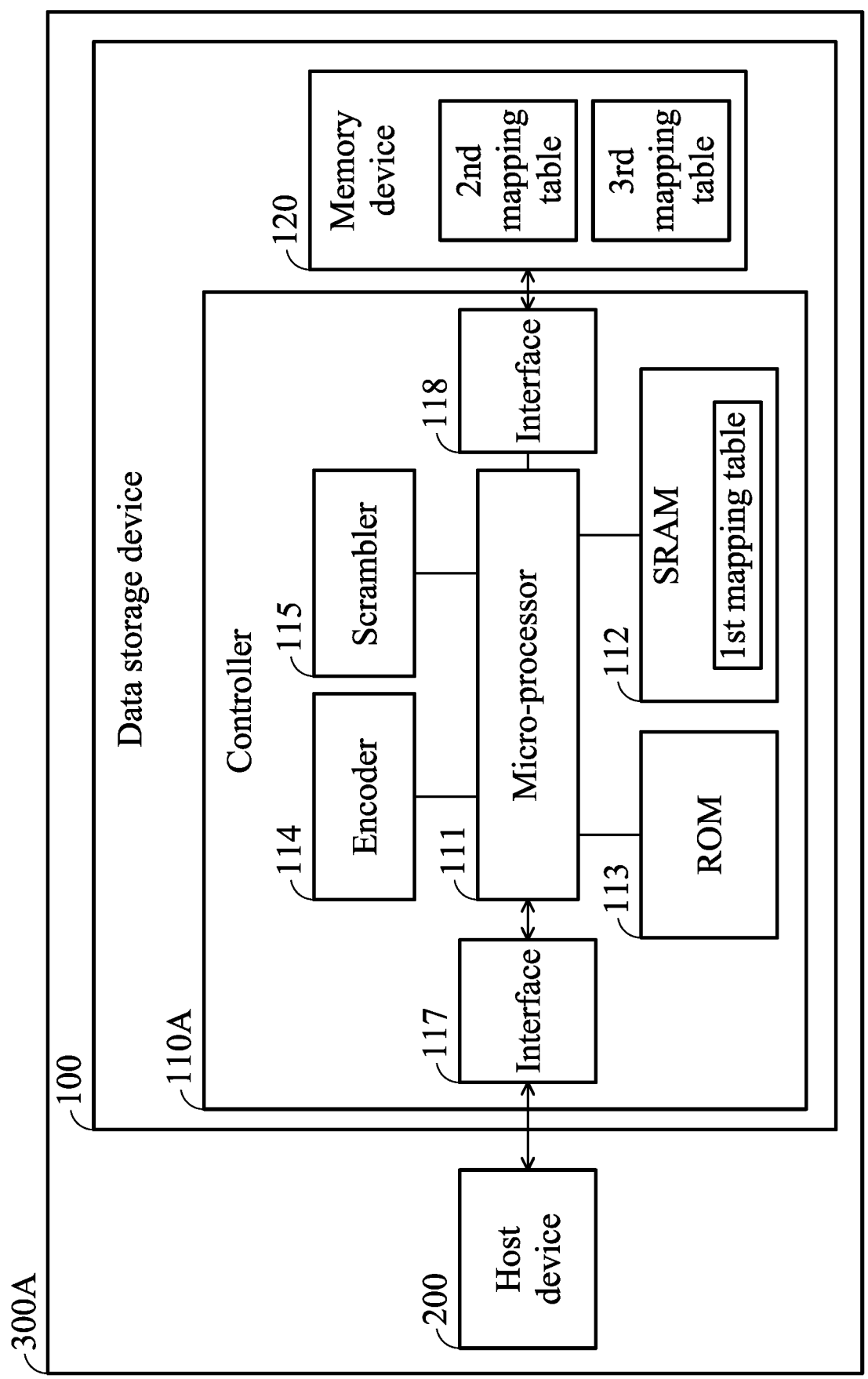
FIG. 1A shows an exemplary block diagram of an electronic device according to an embodiment of the invention.

FIG. 1A shows an exemplary block diagram of an electronic device according to an embodiment of the invention. The electronic device 300A may comprise a data storage device 100 and a host device 200. The electronic device 300A may be a mobile device, such as a smartphone, a smart watch, a tablet computer, etc., but the invention should not be limited thereto.

According to an embodiment of the invention, the data storage device 100 may comprise a controller 110A and a memory device 120. The controller 110A may comprise a micro-processor 111, a Static Random Access Memory (SRAM) 112, a Read Only Memory (ROM) 113, an encoder 114 and a scrambler 115. The memory device 120 may comprise one or more non-volatile memory devices, such as a flash memory.

The host device 200 and the data storage device 100 are connected to each other via a predetermined interface 117. For example, when the data storage device 100 conforms to the Universal Flash Storage (UFS) standards, the host device 200 and the data storage device 100 are connected to each other via the UFS interface. In another example, when the data storage device 100 conforms to the eMMC standards, the host device 200 and the data storage device 100 are connected to each other via the MMC interface. In addition, the controller 110A and the memory device 120 may be connected to each other via another interface.

The ROM 113 is configured to store program codes. The micro-processor 111 is configured to execute the program codes to control access operations of the memory device 120, to utilize the SRAM 112 to perform required data buffering, and to communicate with the host device 200 via the interface 117. The encoder 114 is configured to perform encoding and decoding on the data, and to generate parity check bits utilized for checking and correcting errors according to the content of the data to be written into the memory device 120. The scrambler 115 is configured to scramble (or disturb) the data to be written into the memory device 120 according to the random seeds and to de-scramble the data read from the memory device 1200 according to the corresponding random seeds.

Figure 1B:
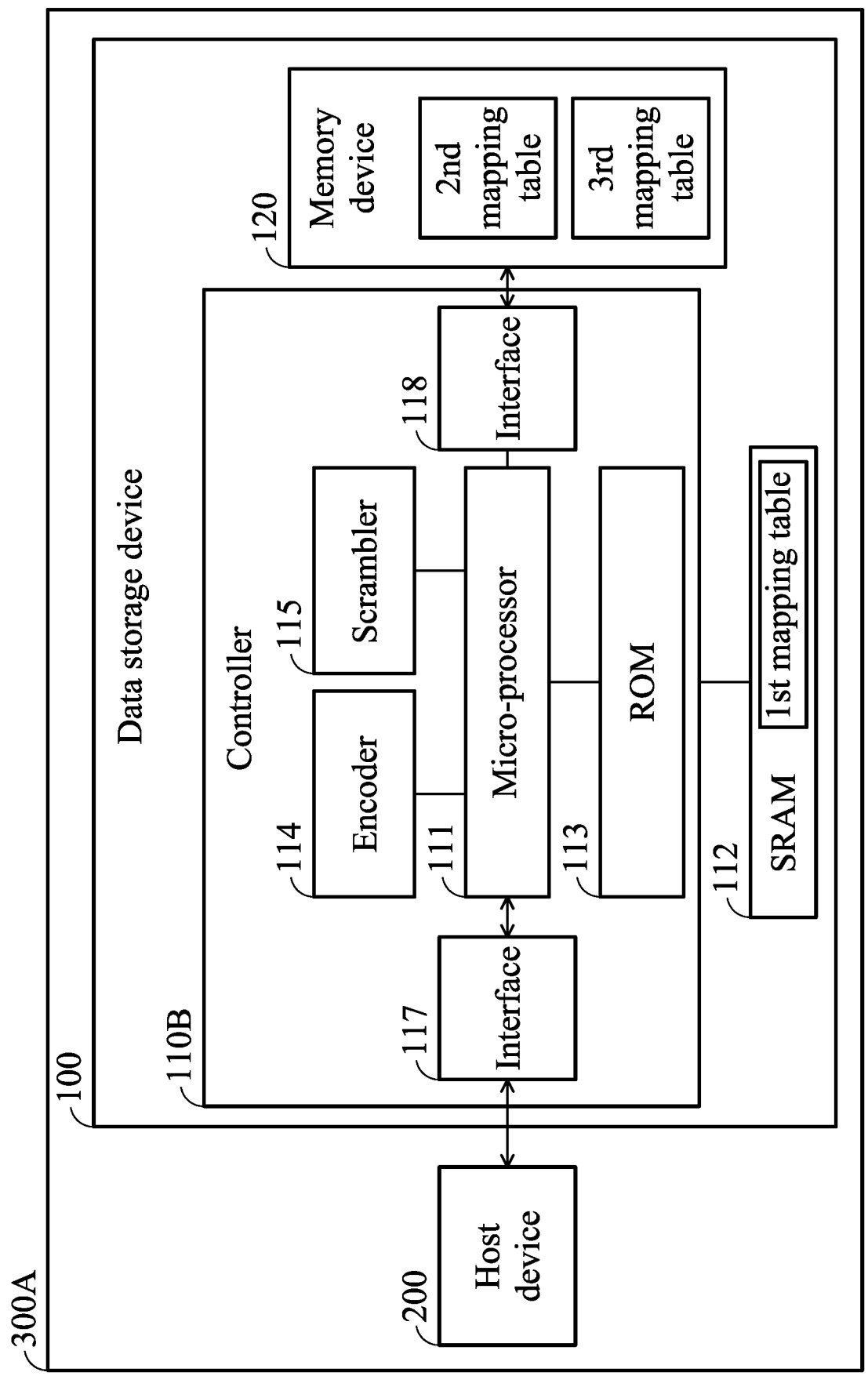
FIG. 1B shows a block diagram of an electronic device according to another embodiment of the invention.

FIG. 1B shows a block diagram of an electronic device 300B according to another embodiment of the invention. In this embodiment, the SRAM 112 is configured outside of the controller 110B and is coupled to the controller 110B.

It should be noted that, to simplify the description, FIG. 1A and FIG. 1B only show the elements related to the invention, and FIG. 1A and FIG. 1B only show two kinds of a plurality of architectures to which the invention can be applied. However, the implementation of the invention is not limited to the elements and architectures shown in FIG. 1A and FIG. 1B.

According to an embodiment of the invention, the memory device 120 may comprise a plurality of memory blocks. The memory blocks may be further grouped into a plurality of Single-level cell (SLC) blocks and a plurality of Multiple-level cell (MLC) blocks. Each memory cell in the SLC block stores one bit data, and each memory cell in the MLC block stores multiple bits of data. For example, according to an embodiment of the invention, each memory cell in the MLC block stores two bits of data.

Each memory block may comprise a plurality of pages. Generally, in the flash memory device, one page is a minimum data block unit for a write task. The size of a physical page is fixed, and the size of a logical page can be flexibly designed according to the firmware programming requirements.

Generally, in order to stabilize the programming of the MLC block, the SLC blocks and a portion of the MLC blocks of the memory device 120 may be utilized as cache memory, or called buffer, for buffering data. When the utilization of the buffer reaches a predetermined level, the controller 110A/110B further writes the data that is currently stored in the buffer into the MLC block(s) or updates or changes the MLC block that was used as a buffer into a data block. In this way, the memory space of the buffer can be released and used again.

The application is applicable to the data storage device having a dual-buffer structure. According to an embodiment of the invention, the memory device 120 may comprise a first buffer Buffer_1 and a second buffer Buffer_2. The first buffer Buffer_1 may comprise one or more MLC blocks, and the second buffer Buffer_2 may comprise one or more SLC blocks.

The first buffer Buffer_1 is configured to store consecutive or large data. For example, the first buffer Buffer_1 is configured to store data of a plurality of consecutive logical pages. The second buffer Buffer_2 is configured to store random or small data. According to an embodiment of the invention, the controller 110A/110B may determine whether to write the data into the first buffer Buffer_1 or the second buffer Buffer_2 according to the size of the predetermined data DATA indicated to be written in a write command and the start host page (HP) number of the predetermined data DATA to be written into the memory device 120. According to an embodiment of the invention, the host pages are a kind of the logical pages.

Generally, the controller 110A/110B receives a write command WCMD from the host device 200 to write predetermined data DATA to the memory device 120. The predetermined data DATA may comprise a plurality of pages (for example, a plurality of logical pages or a plurality of host pages) of data. For example, the predetermined data DATA may be the data stored in the host page HP0~HP10 of the host device 200, where one host page may be set as the data unit for one access operation of the host device 200. As an example, when the size of one physical page is 16K bytes, the size of one host page may be set to 4K bytes.

Because a specific number of host pages of data have to be written continuously when performing the same write command (for example, N host pages have to be written continuously in response to a write command WCMD, where N is a positive integer greater than 1), according to an embodiment of the invention, when the start host page number carried in the write command WCMD is an integer multiple of N (or, the remainder obtained by dividing the start host page number by N is 0), and the size of the predetermined data DATA is greater than or equal to a threshold value or is an integer multiple of the threshold value, the controller 110A/110B may determine to write the data into the first buffer Buffer_1. Otherwise, the controller 110A/110B may determine to write the data into the second buffer Buffer_2.

According to an embodiment of the invention, the first buffer Buffer_1 may be configured to store data of at least N consecutive logical pages, where the specific number N is related to the size of one logical page and the size of one physical page. According to an embodiment of the invention, the threshold value as discussed above may be set as the size of one physical page (for example, 16K bytes), and when the size of one host page is set as 4K bytes, since the size of one physical page equals to four logical pages, the specific number N may be set as 4 (that is, the ratio of the size of one physical page to the size of one logical page). Therefore, in an embodiment of the invention, 4 host pages have to be continuously written by one write command WCMD, and the first buffer Buffer_1 is configured to store data of at least four consecutive logic pages.

According to an embodiment of the invention, take the specific number N=4 as an example, when the start host page number of the write command WCMD is an integer multiple of 4 (or, the remainder obtained by dividing the start host page number by 4 is 0), and the size of the predetermined data DATA is an integer multiple of 16K bytes, the controller 110A/110B may determine to write the data into the first buffer Buffer_1. Otherwise, the controller 110A/110B may determine to write the data into the second buffer Buffer_2.

As an example, when the predetermined data DATA to be written into the memory device 120 is the data belonging the host page HP0~HP3 of the host device, since the remainder obtained when dividing the start host page number 0 by 4 is 0, and the size of the predetermined data DATA equals to the size of one physical page (that is, 4 logical pages), the controller 110A/110B may determine to write the predetermined data into the first buffer Buffer_1. In another example, when the predetermined data DATA to be written into the memory device 120 is the data belonging the host page HP1~HP4 of the host device, even if the size of the predetermined data DATA equals to an integer multiple of the threshold value, the controller 110A/110B may still determine to write the data into the second buffer Buffer_2 since the start host page number 1 is not an integer multiple of 4 (the remainder obtained when dividing the start host page number 1 by 4 is not 0). In addition, when the predetermined data DATA to be written into the memory device 120 is the data belonging the host page HP0~HP2 of the host device, since the size of the predetermined data DATA is not equal to an integer multiple of the threshold value, the controller 110A/110B may determine to write the data into the second buffer Buffer_2.

According to an embodiment of the invention, the controller 110A/110B is configured to maintain a plurality of mapping tables, comprising a first mapping table, a second mapping table and a third mapping table. The first mapping table is a Flash to Host (F2H) mapping table stored in the SRAM 112 that is configured to record which logical pages the data stored in each physical page of the first buffer Buffer_1 and the second buffer Buffer_2 directs to. For example, the first mapping table may record the Logical Block Address (LBA) of the corresponding logical pages.

The second mapping table is a Host to Flash (H2F) mapping table stored in the memory device 120 and configured to record which physical page of which memory block the data corresponding to each logical page directs to (or is stored in). Generally, when the first buffer Buffer_1 is full, the first mapping table (the F2H table) stored in the SRAM 112 corresponding to the first buffer Buffer_1 may be utilized to update the H2F table (that is, the second mapping table as discussed above) stored in the memory device 120. At this time, the memory block that was used as a buffer (e.g. the corresponding first buffer Buffer_1) is also updated or changed into a data block.

The third mapping table is a F2H mapping table stored in the memory device 120 and it is configured to record which logical pages the data stored in each physical page directs to. Similarly, when the first buffer Buffer_1 is full, the content of the first mapping table (the F2H table) stored in the SRAM 112 corresponding to the first buffer Buffer_1 is updated to the memory device 120 (that is, the third mapping table). Therefore, the content of the second mapping table usually corresponds to the content of the third mapping table. Note that, in the embodiments of the invention, the first mapping table (the F2H table) stored in the SRAM 112 has been compressed (which will be discussed in more detailed in the following paragraphs), while the third mapping table (the F2H table) stored in the memory device 120 has not been compressed (that is, the content of the third mapping table can be obtained by decompressing the contents of the first mapping table).

As discussed above, since the first buffer Buffer_1 is configured to store consecutive or large data, for example, storing the data of a plurality of consecutive logical pages, and the first mapping table is stored in the SRAM 112, according to an embodiment of the invention, when the memory space of the SRAM 112 is tight, the controller 110A/110B may edit the first mapping table corresponding to the first buffer Buffer_1 according to the data compression rate (R), so as to reduce the utilization rate of the SRAM 112. The data compression rate (R) means that (X/R) bytes are actually used in the SRAM 112 for storing information regarding X bytes of data, where X and R are positive integers greater than 1. According to an embodiment of the invention, the information recorded in the first mapping table corresponding to the first buffer Buffer_1 has been compressed, and the information recorded in the first mapping table corresponding to the second buffer Buffer_2 has not been compressed.

According to an embodiment of the invention, the first mapping table is configured to record, based on the data compression rate R, which logical page the data stored in each physical page of the first buffer Buffer_1 directs to. Therefore, information (e.g. the Logical Block Address (LBA)) regarding a portion of the logical pages having data stored in the first buffer Buffer_1 is not recorded in the first mapping table. To be more specific, according to an embodiment of the invention, for every R consecutive logical pages having data stored in the first buffer Buffer_1, information (e.g. the Logical Block Address (LBA)) regarding only one logical page is stored in the first mapping table.

According to an embodiment of the invention, the data compression rate R is related to the specific number N. For example, when the specific number N is set as 4, the data compression rate R may be set as being equal to the specific number N or being an integer multiple of the specific number N. Suppose that the data compression rate R=4, according to an embodiment of the invention, for every 4 consecutive logical pages having data stored in the first buffer Buffer_1, the Logical Block Address (LBA) regarding only one logical page is stored in the first mapping table. As an example, when the predetermined data DATA to be written into the memory device 120 is the data belonging the host pages HP0~HP3 of the host device, only the logical block address (LBA) corresponding to the start host page HP0 is recorded in the first mapping table corresponding to the first buffer Buffer_1. In other words, in this example, if there is only the logical block address (LBA) of the host page HP0 recorded for some physical page in the first mapping table corresponding to the first buffer Buffer_1, it means that the data stored in that physical page actually directs to the host pages HP0~HP3. In this manner, the data size required by the compressed mapping table is reduced to only ¼ of the uncompressed one.

Because the first mapping table corresponding to the first buffer Buffer_1 is edited based on the data compression rate R, the data size required by the compressed mapping table can be reduced to 1/R of the uncompressed one. Therefore, when the controller 110A/110B performs an erase operation on the data stored in the first buffer Buffer_1, special data processing is required.

According to an embodiment of the invention, when erasing the data stored in the memory device 120, the controller 110A/110B is configured to clear the corresponding links of the data in the second mapping table and the first mapping table (if the link of the data is also recorded in the first mapping table). To be more specific, suppose that the data to be erased is the data of a plurality of consecutive logical pages, the controller 110A/110B is configured to sequentially clear (for example, by setting the corresponding value to 0xFF) the link of each logical page in the second mapping table and the first mapping table (if the corresponding link is also recorded in the first mapping table). When the corresponding link of one logical page in each mapping table is cleared, the controller 110A/110B is unable to read the data corresponding to that logical page.

Based on the eMMC memory standards, when the controller 110A/110B performs the read, write or erase operation, the host device 200 may issue an interrupt signal (as an example, a High Priority Interrupt (HPI) signal) or a reset command (as an example, a soft reset command) to the data storage device 100. The mechanism of issuing the interrupt signal is to allow suspension of a low priority operation before the low priority operation is completed and performing a high priority operation instead. When the controller 110A/110B receives the HPI signal, the controller 110A/110B may perform soft reset. In addition, when the level of the voltage at the hardware reset pin is pulled low, the controller 110A/110B may also perform soft reset. For example, when the controller 110A/110B detects the interrupt signal or the reset command, the controller 110A/110B must stop or suspend the current read, write or erase operation (even though the operation is not yet completed), and returns the right of controlling the memory device 120 to the host device 200 within a predetermined time (for example, 10 ms). The host device 200 may issue a new command to the data storage device 100 after the predetermined time expires. Generally, once the read, write or erase operation is suspended, the controller 110A/110B will not resume the suspended read, write or erase operation.

However, because the first mapping table corresponding to the first buffer Buffer_1 is edited based on the data compression rate R (for example, for R consecutive host pages HP (r)~HP (r+R) having data stored in the first buffer Buffer_1, the logical block address (LBA) of only one host page is stored in the first mapping table), when the controller 110A/110B receives the interrupt signal or reset command during the erase operation for erasing the data stored in the first buffer Buffer_1, a problem of unsynchronized content corresponding to some host pages in the second mapping table, the third mapping table and the first mapping table will occur.

As an example, suppose that the first mapping table corresponding to the first buffer Buffer_1 only records the logical block address (LBA) of the host page HP(r) to represent information of the consecutive host pages HP(r)~HP (r+R), where r is a positive integer. When the controller 110A/110B receives the interrupt signal or reset command and stops the current erase operation right after the links of the host page HP(r) recorded in the second mapping table and in the first mapping table are cleared, because the first mapping table is a compressed table, the data corresponding to the remaining host pages HP (r+1)~HP (r+R) will also be regarded as being erased after the link of the host page HP(r) recorded in the first mapping table is cleared. Therefore, for the remaining host pages HP (r+1)~HP (r+R), an unwanted read error may occur because their corresponding links in the first mapping table have been cleared (since the link of the host page HP(r) recorded in the first mapping table has been cleared) but their corresponding links in the second mapping table have not yet been cleared. For example, since the corresponding links of the host pages HP (r+1)~HP (r+R) in the second mapping table cannot be synchronously updated, when the reading the data of the host pages HP (r+1)~HP (r+R) thereafter, the controller 110A/110B may possibly return old data.

In addition, when the content of the first mapping table is updated to the second mapping table which is stored in the memory device 120, a Zombie block may be generated due to the unsynchronization of the links stored in the mapping tables. As an example, before the buffer is full, the controller 110A/110B may still update the content currently recorded in the first mapping table to the second mapping table and/or the third mapping table stored in the memory device 120 in advance in order to fulfill some special requirements. For example, when the host device 200 issues a Power Off Notification (PON) command to the controller 110A/110B, the content of the first mapping table may be updated to the H2F (that is, the second mapping table) and/or the F2H table (that is, the third mapping table) stored in the memory device 120. In another example, after the data storage device 100 undergoes a Sudden Power Off Recovery (SPOR) procedure, the content of the re-established first mapping table may be updated to the H2F (that is, the second mapping table) and/or the F2H table (that is, the third mapping table) stored in the memory device 120. At this time, the content of the second mapping table is directed to the physical address of pages storing the data of the host pages (as an example, host pages HP (r)~HP (r+R) discussed above) recorded in the first mapping table. In another example, when the controller 110A/110B notices that a read command is received after a write command after writing consecutive data in response to the write command, and the controller 110A/110B may also update the content currently recorded in the first mapping table to the second mapping table (the H2F table) stored in the memory device 120 in advance before performing the read command. In this manner, the time required to scan the first mapping table from the beginning for the read command can be saved.

Similarly, when the controller 110A/110B stops or suspends the erase operation due to reception of the interrupt signal or the reset command, the data corresponding to some host pages cannot be detected during the procedure of detecting the valid pages, and it cannot be moved, either, when the links of those host pages recorded in the first mapping table have been cleared but the links thereof recorded in the second mapping table still exist. In this manner, a memory block comprising this kind of host page is called a Zombie block.

For example, Zombie blocks may be generated in the following scenarios. Suppose that the controller 110A/110B updates content currently recorded in the first mapping table to the second mapping table stored in the memory device 120 in advance in order to fulfill the special requirement mentioned above, the information regarding the host pages HP (r)~HP (r+R) is also updated to the H2F table (that is, the second mapping table) stored in the memory device 120 when the first mapping table (the F2H table) corresponding to the first buffer Buffer_1 records the logical block address (LBA) of the host page HP(r) to represent information of the consecutive host pages HP(r)~HP (r+R).

Suppose that in response to reception of the interrupt signal or the reset command, the controller 110A/110B suspends the erase operation right after the controller 110A/110B cleared the link of the host page HP (r) recorded in the first mapping table, the links of the remaining host pages HP (r+1)~HP (r+R) recorded in the second mapping table cannot be updated accordingly due to the suspension of the erase operation. Thereafter, when the first buffer Buffer_1 is full, the memory block which is used as the buffer (that is, the memory block corresponding to the first buffer Buffer_1) will be updated or changed to a data block, and the controller 110A/110B will further update the content of the uncompressed F2H table (that is, the third mapping table) stored in the memory device 120 based on content of the first mapping table (F2H table), wherein the F2H table (that is, the third mapping table) stored in the memory device 120 is utilized in the future garbage collection procedure to assist the controller 110A/110B with finding out the valid pages.

Since the link corresponding to the host page HP(r) recorded in the first mapping table (the F2H table) has been cleared, the links of the host pages HP (r)~HP (r+R) in the third mapping table (F2H table) will be all recorded as 0xFF. Thereafter, when a garbage collection procedure is triggered later, even though the data corresponding to the host pages HP (r+1)~HP (r+R) stored in the data block are all valid data, those host pages will not be picked up to check whether the physical addresses corresponding to the host pages HP (r+1)~HP (r+R) in the second mapping table (H2F table) are corresponding to the physical addresses of the physical page of the data block storing the data corresponding to the host pages HP (r+1)~HP (r+R) because the links of the host pages HP (r)~HP (r+R) are all recorded as 0xFF in the third mapping table. That is, although the data corresponding to the host pages HP (r+1)~HP (r+R) are all valid, it cannot be detected via the third mapping table during the garbage collection procedure. In addition, the data corresponding to the host pages HP (r+1)~HP (r+R) cannot be moved out from the data block, either, thereby generating a Zombie block.

To avoid the unwanted problems discussed above, according to an embodiment of the invention, when the controller 110A/110B performs an erase operation to erase the data stored in the first buffer Buffer_1, special data processing should be performed, so as to prevent the content of mapping tables from being unsynchronized caused by the reception of interrupt signal or the reset command during the erase operation, where the content unsynchronization problems may cause the controller 110A/110B to erroneously return old data or cause a Zombie block to be generated. In the following paragraphs, special data processing will be discussed further.

According to an embodiment of the invention, when the controller 110A/110B performs an erase operation to erase the data stored in the first buffer Buffer_1 in response to an erase command, the controller 110A/110B is configured to check whether an interrupt signal or a reset command has been issued by a host device (or check whether an interrupt signal or a reset command has been received) every time the erase operations of a predetermined number (M) of logical pages have finished, wherein the predetermined number (M) is a positive integer greater than 1.

According to an embodiment of the invention, the predetermined number is related to the data compression rate (R) of the first mapping table corresponding to the first buffer Buffer_1, where M may be equal to R (M=R) or M may be greater than R (M>R) and is an integer multiple of R, or, R may be greater than M (R>M) and is an integer multiple of M. In other words, in the embodiments of the invention, the controller 110A/110B is not configured to check whether an interrupt signal or a reset command has been issued by a host device (or check whether an interrupt signal or a reset command has been received) every time the erase operation of one logical page has finished. Instead, in the embodiments of the invention, the controller 110A/110B is configured to check whether an interrupt signal or a reset command has been issued by a host device (or check whether an interrupt signal or a reset command has been received) only when the erase operations of a predetermined number (M) of logical pages have been finished (that is, only check whether an interrupt signal or a reset command has been received for every M logical pages). Or, the controller 110A/110B is configured to check whether an interrupt signal or a reset command has been issued by a host device (or check whether an interrupt signal or a reset command has been received) only when the remainder obtained by dividing the host page number of the currently erased host page by M is 0.

As discussed above, since the host device 200 may issue a new command to the data storage device 100 after the predetermined time expires, the predetermined number M may be adjusted according to the length of the predetermined time. As an example the predetermined number M is adequately selected, such that the controller 110A/110B can finish the erase operations of M logical pages within the predetermined time. In this manner, even if the controller 110A/110B cannot check whether an interrupt signal or a reset command has been issued by a host device (or check whether an interrupt signal or a reset command has been received) right away when every time the erase operation of one logical page has been finished, the new command can still be received in time after the predetermined time expires, which is in compliance with the memory standards.

It should be noted that the special data processing design discussed above is applicable to the erase operation when the amount of data to be erased by the erase command is greater than or equal to the threshold value as discussed above, or is an integral multiple of the threshold value as discussed above, or the data to be erased is a specific number (N) of consecutive logical pages.

According to an embodiment of the invention, when the amount of data to be erased by the erase command is greater than or equal to the threshold value as discussed above, or is an integral multiple of the threshold value as discussed above, or the data to be erased is a specific number (N) of consecutive logical pages, and the start host page number of the data to be erased is an integer multiple of N (or, the remainder obtained by dividing the start host page number by N is 0), the controller 110A/110B may be designed to check whether an interrupt signal or a reset command has been issued by a host device (or check whether an interrupt signal or a reset command has been received) only when the erase operations of a predetermined number (M) of logical pages have been finished. In an erase operation in this design, the controller 110A/110B will clear the links of the logical pages in the mapping tables instead of rewriting the data corresponding to the logical page to 0.

According to an embodiment of the invention, the predetermined number M is related to the specific number N, where M may be equal to N (M=N) or M may be greater than N (M>N) and is an integer multiple of N, or, N may be greater than M (N>M) and is an integer multiple of M.

In an embodiment of the invention, N=M=R. Therefore, in an embodiment of the invention, the predetermined number M may be related to the size of one logical page and the size of one physical page. For example, the predetermined number M may be designed as a ratio of the size of one physical page to the size of one logical page. In addition, the data compression rate R may also be related to the size of one logical page and the size of one physical page. For example, the data compression rate R may also be designed as a ratio of the size of one physical page to the size of one logical page.

Figure 2:
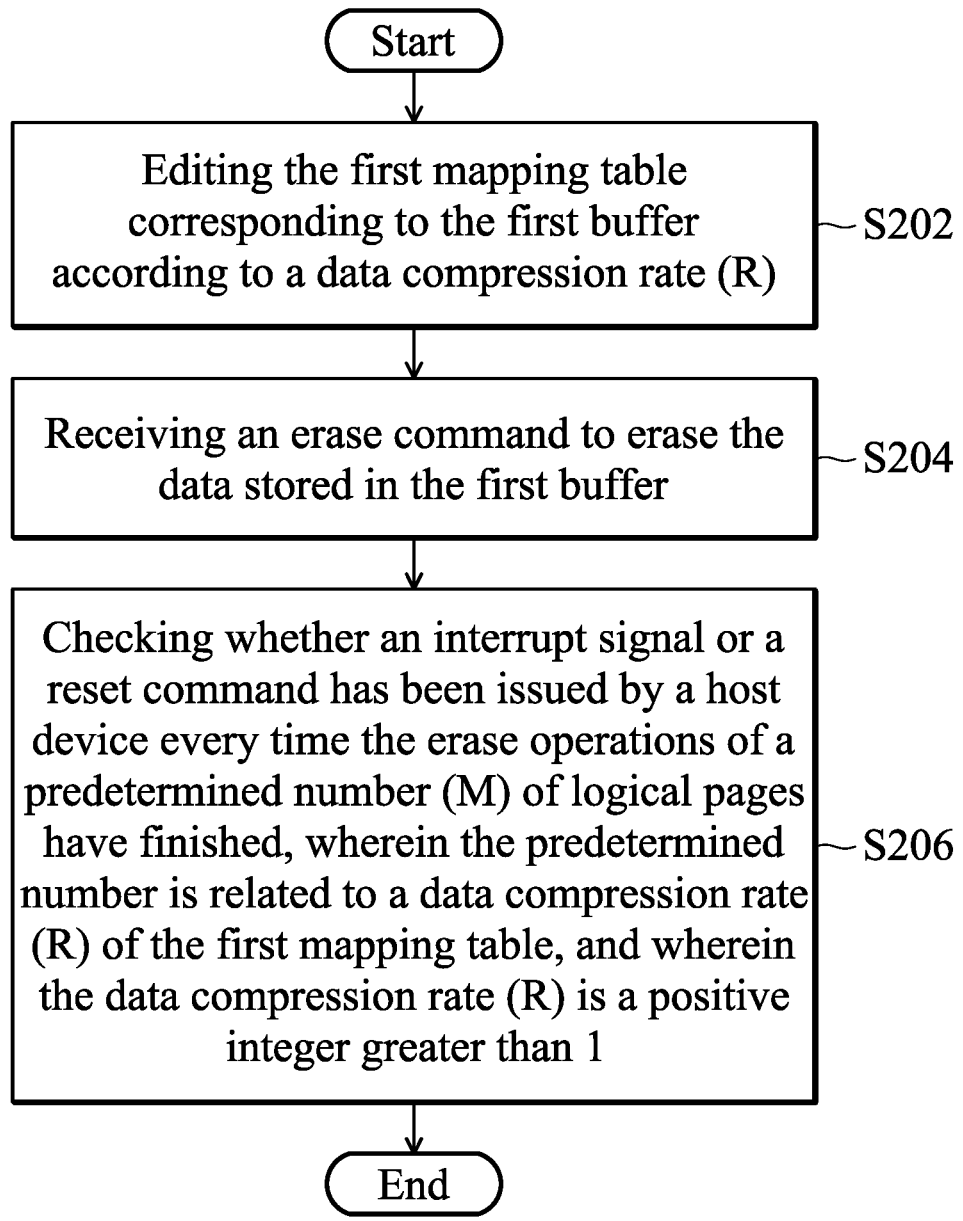
FIG. 2 is an exemplary flow chart of a method for processing data according to an embodiment of the invention.

FIG. 2 is an exemplary flow chart of a method for processing data according to an embodiment of the invention. First of all, the controller is configured to edit the first mapping table corresponding to the first buffer Buffer_1 according to the data compression rate (R) (step S202). As discussed above, the first mapping table records which logical page the data stored in each physical page of the first buffer Buffer_1 directs to. In addition, in the first mapping table, information regarding one logical page is able to represent information of R consecutive host pages comprising that logical page.

Next, when the controller receives an erase command to erase the data stored in the first buffer Buffer_1 (step S204), and when the amount of data to be erased by the erase command is an integral multiple of the threshold value as discussed above (or the data to be erased is a specific number (N) of consecutive logical pages), and the start host page number of the data to be erased is an integer multiple of N (or, the remainder obtained by dividing the start host page number by N is 0), the controller is configured to check whether an interrupt signal or a reset command has been issued by a host device (or check whether an interrupt signal or a reset command has been received) every time the erase operations of a predetermined number (M) of logical pages have finished (Step S206).

Figure 3:
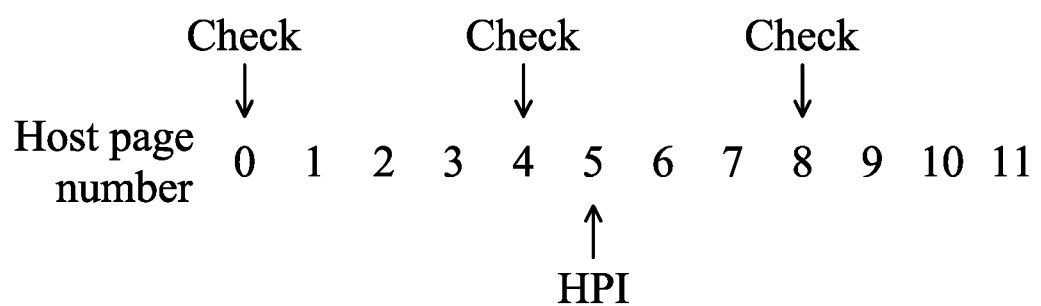
FIG. 3 is an exemplary diagram showing the check points of checking whether an interrupt signal or a reset command has been issued by a host device according to an embodiment of the invention.

FIG. 3 is an exemplary diagram showing the check points of checking whether an interrupt signal or a reset command has been issued by a host device (or checking whether an interrupt signal or a reset command has been received) according to an embodiment of the invention. In this embodiment, N=M=R=4. Suppose that the data to be erased by an erase command is the data corresponding to the host pages HP0~HP11 in the first buffer Buffer_1, the controller 110A/110B may check whether an interrupt signal or a reset command issued by the host device has been received every 4 logical pages. Suppose that the host device 200 issues an interrupt signal HPI when the controller 110A/110B performs the erase operation on the data corresponding to the host page HP5, the controller 110A/110B is able to detect this HPI signal before performing the erase operation on the data corresponding to the host page HP8 (or, after performing the erase operation on the data corresponding to the host page HP7), and the controller 110A/110B may stop or suspend the current erase operation right away. Therefore, in response to the reception of the interrupt signal HPI, the controller 110A/110B will not further erase the data corresponding to the host pages HP8~HP11. In addition, since the erase operations of the data corresponding to the host pages HP4~HP7 have been finished before the suspension, and the links corresponding to the host pages HP4~HP7 in the mapping tables have been all cleared, the problem of erroneously returning old data by the controller 110A/110B or causing the Zombie block due to the unsynchronization of the links stored in the mapping tables can be prevented, and the performance of the memory device will be further improved.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

The term "coupled" in the specification of the invention generally refers to various direct or indirect electrical connections. While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A data storage device, comprising:
   a memory device, comprising a first buffer configured to store data of a plurality of consecutive logical pages;
   a Static Random Access Memory (SRAM), configured to store a first mapping table, wherein the first mapping table records which logical page the data stored in each physical page of the first buffer directs to; and
   a controller, coupled to the memory device and the SRAM, wherein when the controller performs an erase operation to erase the data stored in the first buffer in response to an erase command, the controller checks whether an interrupt signal or a reset command issued by a host device has been received every time the erase operations of a predetermined number (M) of logical pages have finished, wherein the predetermined number (M) is a positive integer greater than 1.

2. The data storage device as claimed in claim 1, wherein the predetermined number is related to a data compression rate (R) of the first mapping table, and wherein the data compression rate (R) is a positive integer greater than 1.

3. The data storage device as claimed in claim 2, wherein the controller is configured to edit the first mapping table according to the data compression rate (R), and wherein information regarding a portion of the logical pages having data stored in the first buffer is not recorded in the first mapping table.

4. The data storage device as claimed in claim 1, wherein for every R consecutive logical pages having data stored in the first buffer, information regarding only one logical page is stored in the first mapping table, and wherein R is a positive integer greater than 1.

5. The data storage device as claimed in claim 1, wherein the predetermined number (M) is an integer multiple of a data compression rate (R) of the first mapping table.

6. The data storage device as claimed in claim 1, wherein the first buffer is configured to store data of a specific number (N) of consecutive logical pages, and wherein the specific number (N) is related to a size of one logical page and a size of one physical page.

7. A method for processing data stored in a memory device, suitable for a data storage device comprising a memory device, a Static Random Access Memory (SRAM) and a controller, the memory device comprising a first buffer configured to store data of a plurality of consecutive logical pages, the SRAM being configured to store a first mapping table, the method comprising:
   editing, by the controller, the first mapping table according to a data compression rate (R), wherein the first mapping table records which logical page the data stored in each physical page of the first buffer directs to, and wherein information regarding a portion of the logical pages having data stored in the first buffer is not recorded in the first mapping table;
   performing, by the controller, an erase operation to erase the data stored in the first buffer in response to an erase command; and
   when performing the erase operation to erase the data stored in the first buffer in response to the erase command,
   checking, by the controller, whether an interrupt signal or a reset command issued by a host device has been received every time the erase operations of a predetermined number (M) of logical pages have finished, wherein the predetermined number (M) is a positive integer greater than 1, and wherein the predetermined number is related to the data compression rate (R) of the first mapping table.

8. The method as claimed in claim 7, wherein the predetermined number (M) is an integer multiple of the data compression rate (R) of the first mapping table.

9. The method as claimed in claim 7, wherein for every R consecutive logical pages having data stored in the first buffer, information regarding only one logical page is stored in the first mapping table.

10. The method as claimed in claim 7, wherein the first buffer is configured to store data of a specific number (N) of consecutive logical pages, and wherein the specific number (N) is related to a size of one logical page and a size of one physical page.

\* \* \* \* \*